(12) United States Patent
Naito

(10) Patent No.: US 10,847,613 B2
(45) Date of Patent: Nov. 24, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/228,806

(22) Filed: Dec. 21, 2018

(65) Prior Publication Data

US 2019/0221642 A1 Jul. 18, 2019

(30) Foreign Application Priority Data

Jan. 17, 2018 (JP) .................................. 2018-005955

(51) Int. Cl.
| | |
|---|---|
| *H01L 29/08* | (2006.01) |
| *H01L 29/739* | (2006.01) |
| *H01L 29/10* | (2006.01) |
| *H01L 29/40* | (2006.01) |
| *H01L 29/66* | (2006.01) |
| *H01L 21/265* | (2006.01) |
| *H01L 21/324* | (2006.01) |

(Continued)

(52) U.S. Cl.
CPC ...... *H01L 29/0804* (2013.01); *H01L 21/2253* (2013.01); *H01L 21/26513* (2013.01); *H01L 21/26586* (2013.01); *H01L 21/324* (2013.01); *H01L 29/083* (2013.01); *H01L 29/1095* (2013.01); *H01L 29/407* (2013.01); *H01L 29/66348* (2013.01); *H01L 29/7397* (2013.01); *H01L 29/0696* (2013.01)

(58) Field of Classification Search
CPC .......... H01L 29/0804; H01L 21/26586; H01L 29/7397; H01L 29/66333; H01L 29/66348
See application file for complete search history.

(56) References Cited

U.S. PATENT DOCUMENTS

| | | | |
|---|---|---|---|
| 6,274,437 B1 | 8/2001 | Evans | |
| 2009/0020852 A1* | 1/2009 | Harada | ............... H01L 29/0696 257/579 |

(Continued)

FOREIGN PATENT DOCUMENTS

| | | |
|---|---|---|
| JP | H11508087 A | 7/1999 |
| JP | 2017059817 A | 3/2017 |
| WO | 2017006711 A1 | 1/2017 |

*Primary Examiner* — Cuong Q Nguyen
*Assistant Examiner* — Shih Tsun A Chou

(57) ABSTRACT

A semiconductor device is provided. The semiconductor device includes a mesa portion provided inside the semiconductor substrate and in contact with the gate trench portion, wherein the mesa portion has, at an end portion of an upper surface thereof, a shoulder portion in contact with the gate trench portion, the shoulder portion has an outwardly convex shape, the mesa portion has a first conductivity type emitter region that: is in contact with the gate trench portion and positioned between the upper surface of the semiconductor substrate and the drift region; and has a doping concentration higher than the drift region, a lower end of the emitter region at a position in contact with the gate trench portion is located at a deeper position in the depth direction than a lower end of the emitter region at a middle, in the transverse direction, of the mesa portion.

9 Claims, 15 Drawing Sheets

(51) Int. Cl.
*H01L 21/225* (2006.01)
*H01L 29/06* (2006.01)

(56) References Cited

U.S. PATENT DOCUMENTS

2013/0001681 A1* 1/2013 Sin .................... H01L 21/26586
257/330
2017/0077274 A1 3/2017 Naito
2017/0301779 A1 10/2017 Naito

* cited by examiner

D-D

D-D

SEMICONDUCTOR DEVICE

BACKGROUND

1. Technical Field

The present invention relates to a semiconductor device.

2. Related Art

Conventionally, a semiconductor device including a gate trench and a mesa portion is known (please see Patent Literature 1, for example).
Patent Literature 1: WO2017/006711

The upper surface of the mesa portion is connected with an electrode such as an emitter electrode. Because of this, an effective width of the upper surface of the mesa portion in which connections with the electrodes can be formed is preferably large.

SUMMARY

In order to solve the above-mentioned drawbacks, one of aspects of the present invention provides a semiconductor device comprising a semiconductor substrate having a first conductivity type drift region. The semiconductor device may include a gate trench portion that: lies, in a depth direction of the semiconductor substrate, from an upper surface of the semiconductor substrate to a position reaching the drift region; and is provided at the upper surface of the semiconductor substrate and extending in a predetermined longitudinal direction. The semiconductor device may include a mesa portion provided inside the semiconductor substrate and in contact with the gate trench portion. The mesa portion may have, at an end portion of an upper surface thereof, a shoulder portion in contact with the gate trench portion. Assuming that the mesa portion side is an inner side and the gate trench portion side is an outer side in a transverse cross-section perpendicular to the longitudinal direction, the shoulder portion may have an outwardly convex shape. The mesa portion may have a first conductivity type emitter region that: is in contact with the gate trench portion and positioned between the upper surface of the semiconductor substrate and the drift region; and has a doping concentration higher than the drift region. Assuming that a direction perpendicular to both the depth direction and the longitudinal direction is a transverse direction, a lower end of the emitter region at a position in contact with the gate trench portion may be located at a deeper position in the depth direction than a lower end of the emitter region at a middle, in the transverse direction, of the mesa portion.

The shoulder portion may have a side wall connected substantially perpendicularly to the upper surface of the semiconductor substrate. A radius of curvature of the shoulder portion in the transverse cross-section may be smaller than 15% of a width, in the transverse direction, of the mesa portion at a middle position, in the depth direction, of the gate trench portion.

The emitter region may have: an upper region including the middle of the mesa portion; and a lower region that is provided in a region in contact with the gate trench portion and protrudes downward from the upper region. Below a connecting part at which the lower region connects with the upper region, the lower region may have a transverse wide part with a width in the transverse direction larger than the connecting part.

The emitter region may have: an upper region including the middle of the mesa portion; and a lower region that is provided in a region in contact with the gate trench portion and protrudes downward from the upper region. In the transverse cross-section, a lower surface of the upper region and a side surface of the lower region may be connected substantially perpendicularly.

In the transverse cross-section, an angle formed between a lower surface of the upper region and a side surface of the lower region may be smaller than an angle formed between an upper surface of the upper region and a side wall of the shoulder portion.

In a region in contact with the gate trench portion, a doping concentration distribution, in the depth direction, of the emitter region may have a local minimum value at a position corresponding to a connecting part at which the lower region and the upper region are connected.

In a longitudinal cross-section perpendicular to the transverse direction of the mesa portion of a region in contact with the gate trench portion, below a connecting part at which the lower region connects with the upper region, the lower region may have a longitudinal wide part with a width in the longitudinal direction larger than the connecting part.

A length of protrusion of the longitudinal wide part from the connecting part in the longitudinal direction may be between 0.1 μm and 0.3 μm inclusive.

The mesa portion may have: a second conductivity type base region provided below the emitter region; and a second conductivity type contact region that: is located alternating with the emitter region in the longitudinal direction; and has a doping concentration higher than the base region. The contact region may be in contact with a connecting part at which the lower region and the upper region are connected.

The summary clause does not necessarily describe all necessary features of the embodiments of the present invention. The present invention may also be a sub-combination of the features described above.

BRIEF DESCRIPTION OF THE DRAWINGS

FIG. 13A is a figure showing an exemplary cross-section taken along D-D in

FIG. 2.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in the direction parallel with the depth direction of a semiconductor substrate is referred to as an "upper" side, and the other side is referred to as a "lower" side. Among two principal surfaces of a substrate, a layer or another member, one surface is referred to as an upper surface, and the other surface is referred to as a lower surface. The "upward" and "downward" directions are not limited by the direction of gravity or a direction of attachment to a substrate or the like at the time of implementation of a semiconductor device.

In the present specification, technical matters are occasionally explained using orthogonal coordinate axes including the X-axis, Y-axis and Z-axis. In the present specification, a surface parallel with the upper surface of a semiconductor substrate is denoted as an X-Y plane, and the depth direction perpendicular to the upper surface of the semiconductor substrate is denoted as the Z-axis.

Although in each example shown, the first conductivity type is N type, and the second conductivity type is P type, the first conductivity type may be P type, and the second conductivity type may be N type. In this case, conductivity types of substrates, layers, regions and the like in each example become opposite polarities, respectively. In addition, in the present specification, P+ type (or N+ type) means a doping concentration higher than P type (or N type), and P− type (or N− type) means a doping concentration lower than P type (or N type).

In the present specification, doping concentrations refer to concentrations of impurities that are turned into a donor or acceptor. In the present specification, a net doping concentration which is a difference in concentrations of a donor and an acceptor is occasionally regarded as a doping concentration. In addition, a peak value of a doping concentration distribution in a doping region is occasionally regarded as a doping concentration in the doping region.

Figure 1:
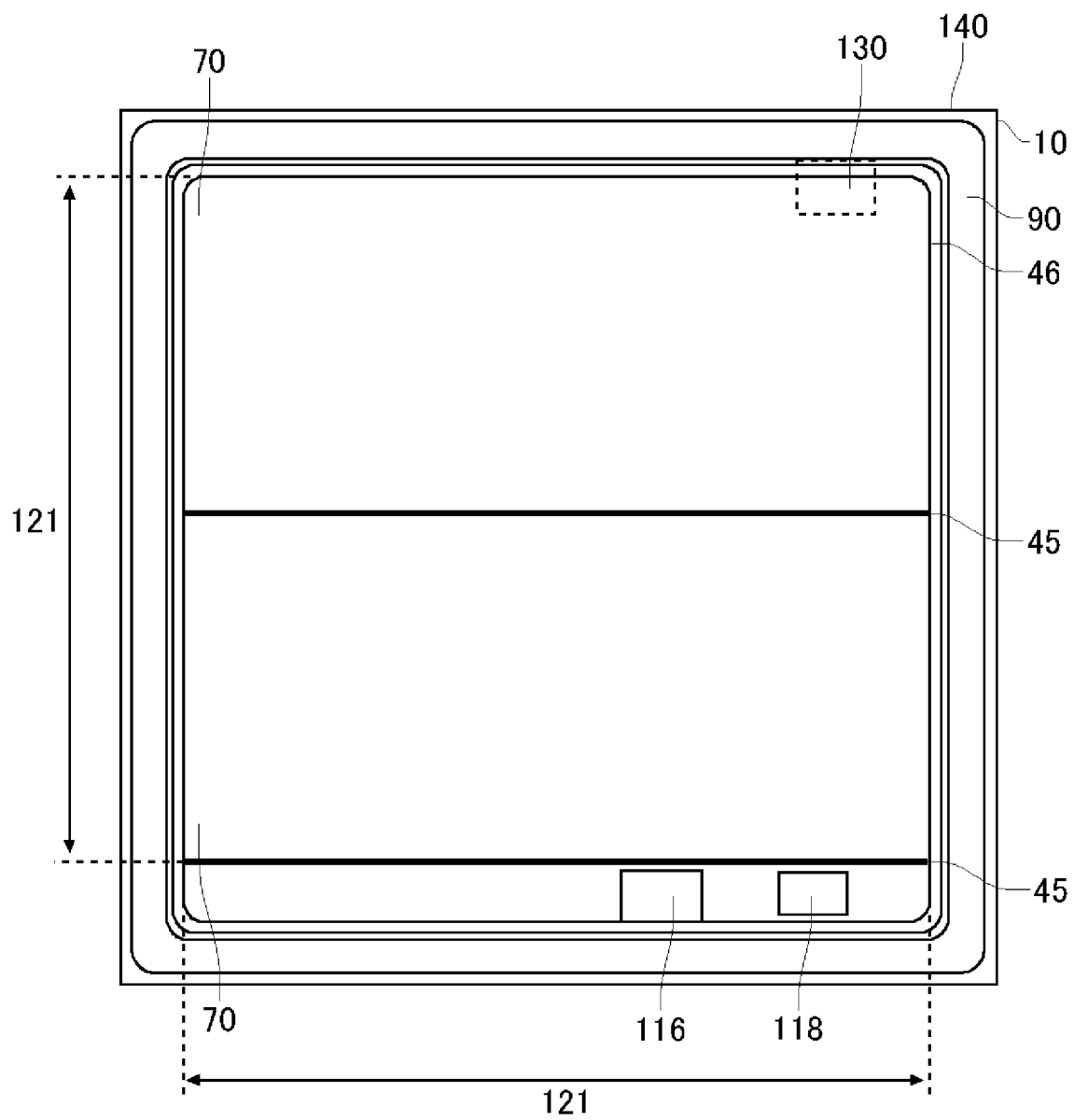
FIG. 1 is a figure showing the structure of the upper surface of a semiconductor device 100 according to one embodiment of the present invention.

FIG. 1 is a figure showing the structure of the upper surface of a semiconductor device 100 according to one embodiment of the present invention. The semiconductor device 100 includes a semiconductor substrate 10. The semiconductor substrate 10 may be a silicon substrate, a silicon carbide substrate, a nitride semiconductor substrate such as a gallium nitride semiconductor substrate or the like. The semiconductor substrate 10 of the present example is a silicon substrate. In the present specification, a circumferential end portion of the semiconductor substrate 10 in a top view is denoted as a circumferential end 140. The top view refers to a view when seen from the upper surface side of the semiconductor substrate 10 in a direction parallel with the Z-axis.

The semiconductor device 100 includes an active portion 121 and an edge termination structure portion 90. The active portion 121 is a region where principal current flows between the upper surface and lower surface of the semiconductor substrate 10 when the semiconductor device 100 is controlled to be turned on. That is, it is a region where current flows inside the semiconductor substrate 10 in its depth direction from the upper surface of the semiconductor substrate 10 to its lower surface or from the lower surface to the upper surface.

In the example of FIG. 1, regions having gate runners 45 are also included in the active portion 121. The active portion 121 can be regarded as a region having emitter electrodes when seen in the top view of the semiconductor substrate 10 and a region sandwiched by regions having the emitter electrodes. In the example of FIG. 1, emitter electrodes are provided above a transistor portion 70.

The active portion 121 has the transistor portion 70. The transistor portion 70 includes a transistor such as an insulated-gate bipolar transistor (IGBT). In addition to the transistor portion 70, the active portion 121 may have diode portions to function as free wheel diodes (FWD). In this case, each diode portion have an N+ type cathode region in a region in contact with the lower surface of the semiconductor substrate 10. In the semiconductor device 100 of the present example, a region which is in a region in contact with the lower surface of the semiconductor substrate 10 and is not in the cathode region is a P+ type collector region.

At the upper surface of the semiconductor substrate 10, the edge termination structure portion 90 is provided between the active portion 121 and circumferential end 140 of the semiconductor substrate 10. The edge termination structure portion 90 may be located in a ring-like form to surround the active portion 121 at the upper surface of the semiconductor substrate 10. The edge termination structure portion 90 of the present example is located along the circumferential end 140 of the semiconductor substrate 10. The edge termination structure portion 90 relaxes electric field concentration at the upper surface side of the semiconductor substrate 10. The edge termination structure portion 90 for example has a guard ring, a field plate, a RESURF or a structure obtained by combining them.

At the upper surface of the semiconductor substrate 10, a gate metal layer 46 is provided between the edge termination structure portion 90 and the active portion 121. Although an interlayer dielectric film is provided between the gate metal layer 46 and the semiconductor substrate 10, it is omitted in FIG. 1.

The gate metal layer 46 may be provided to surround the active portion 121 in the top view of the semiconductor substrate 10. The gate metal layer 46 is electrically connected with a gate pad 116 provided outside the active portion 121. The gate pad 116 may be located between the gate metal layer 46 and the active portion 121. A pad such as an emitter pad 118 electrically connected with an emitter electrode may be provided between the gate metal layer 46 and the active portion 121.

The gate metal layer 46 may be formed of aluminum or an aluminum-silicon alloy. The gate metal layer 46 is electrically connected to the transistor portion 70, and supplies the transistor portion 70 with gate voltage.

The gate runners 45 are electrically connected with the gate metal layer 46, and extend to positions at which they overlap with the active portion 121. At least one gate runner 45 may be provided traversing the active portion 121 in the Y-axis direction. The gate runners 45 supply the transistor portion 70 with gate voltage. The gate runners 45 may be formed of a semiconductor material such as polysilicon doped with impurities or may be formed of a metal. The gate runners 45 are provided above or inside the semiconductor substrate 10, and the semiconductor substrate 10 and gate runners 45 are insulated by an insulating film.

Figure 2:
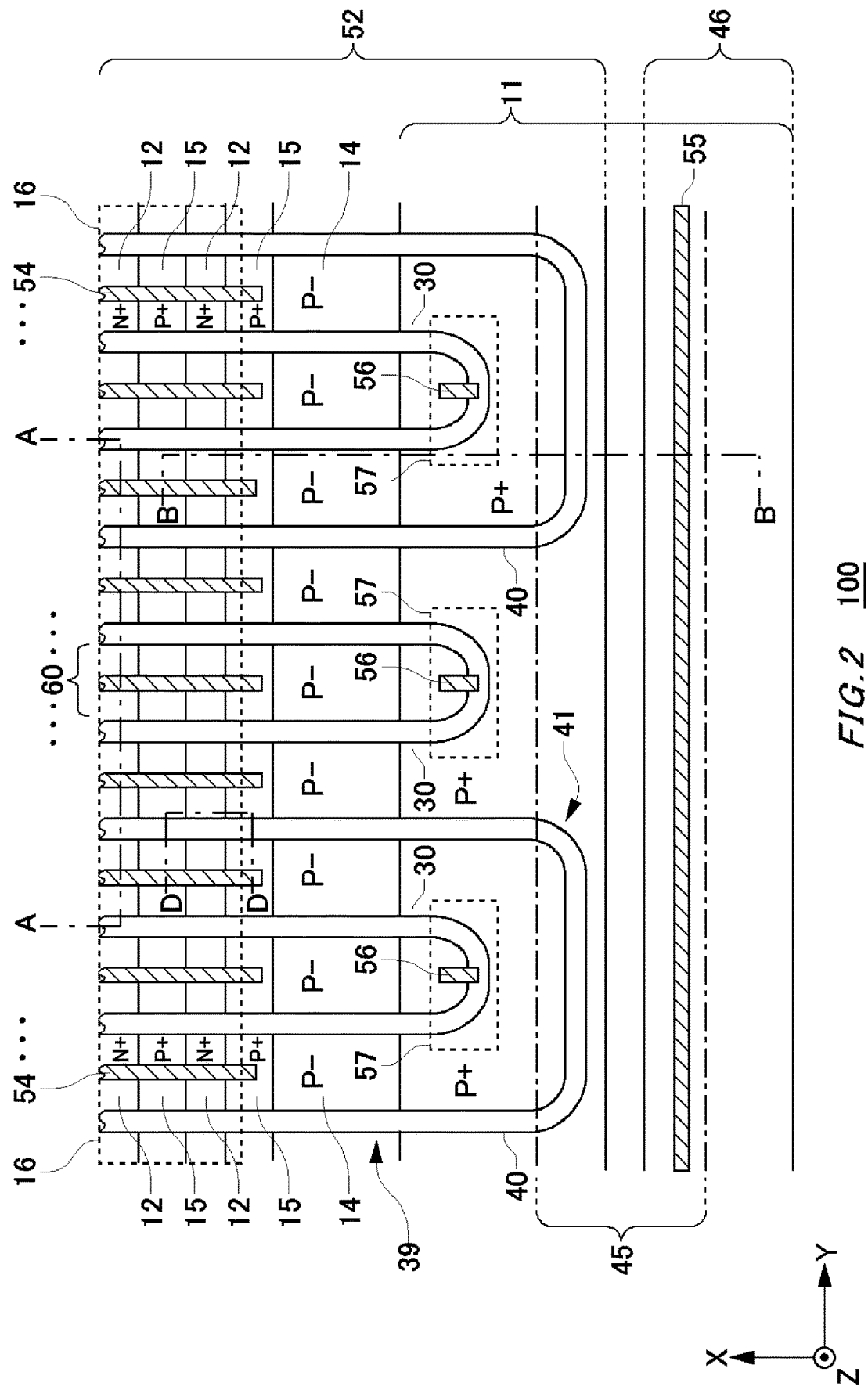
FIG. 2 is a figure showing an enlarged view of a section close to a region 130 in FIG. 1.

FIG. 2 is a figure showing an enlarged view of a section close to a region 130 in FIG. 1. The semiconductor device 100 of the present example includes gate trench portions 40, dummy trench portions 30, emitter regions 12, base regions 14, contact regions 15, an accumulation region 16 and a well region 11 that are provided inside the semiconductor substrate 10. In the present specification, the gate trench portions 40 or dummy trench portions 30 are occasionally referred to simply as trench portions.

The accumulation region 16 is not exposed to the upper surface of the semiconductor substrate 10. In FIG. 2, a region having the accumulation region 16 in the X-Y plane parallel with the upper surface of the semiconductor substrate 10 is indicated with broken lines. In addition, the semiconductor device 100 of the present example includes an emitter electrode 52 and the gate metal layer 46 that are provided above the upper surface of the semiconductor substrate 10. The emitter electrode 52 and gate metal layer 46 are provided separate from each other.

Although an interlayer dielectric film is provided between the emitter electrode 52 and gate metal layer 46, and the upper surface of the semiconductor substrate 10, it is omitted in FIG. 2. The interlayer dielectric film of the present example has contact holes 54, a contact hole 55 and contact holes 56, all of which penetrate the interlayer dielectric film.

The emitter electrode 52 passes through the contact holes 54, and contacts the emitter regions 12, contact regions 15 and base regions 14 at the upper surface of the semiconductor substrate 10. The contact holes 54 of the present example are provided between individual trench portions. In addition, the emitter electrode 52 passes through the contact holes 56, and is connected with dummy conductive portions in the dummy trench portions 30. Connecting portions 57 formed of a conductive material such as polysilicon doped with impurities may be provided between the emitter electrode 52 and the dummy conductive portions. The connecting portions 57 are provided at the upper surface of the semiconductor substrate 10. In the present example, the contact holes 56 are located at edges, in the X-axis direction, of the dummy trench portions 30. An insulating film is provided between the connecting portions 57 and the semiconductor substrate 10.

The gate metal layer 46 passes through the contact hole 55, and contacts a gate runner 45. The gate runner 45 is formed of polysilicon doped with impurities or the like. The gate runner 45 is connected with gate conductive portions in the gate trench portions 40 at the upper surface of the semiconductor substrate 10. The gate runner 45 is not connected with the dummy conductive portions in the dummy trench portions 30. The gate runner 45 of the present example lies from below the contact hole 55 to edge portions 41 of the gate trench portions 40. At the edge portions 41 of the gate trench portions 40, the gate conductive portions are exposed to the upper surface of the semiconductor substrate 10, and contact the gate runner 45. An insulating film is provided between the gate runner 45 and the semiconductor substrate 10. In another example, the semiconductor device 100 may not have a gate runner 45, and the gate metal layer 46 and the gate trench portions 40 may be directly connected.

An insulating film such as an oxide film is provided between the gate runner 45 and the semiconductor substrate 10. At the edge portions 41 of the gate trench portions 40, the gate conductive portions are exposed to the upper surface of the semiconductor substrate 10. The insulating film above the gate conductive portions has contact holes to connect the gate conductive portions and the gate runner 45. Although in FIG. 2, there is a portion in the plan view where the emitter electrode 52 and the gate runner 45 overlap, the emitter electrode 52 and the gate runner 45 are electrically insulated from each other with an unillustrated insulating film being sandwiched therebetween.

The emitter electrode 52 and gate metal layer 46 are formed of metal-containing materials. For example, at least a partial region of each electrode is formed of aluminum or an aluminum-silicon alloy. Each electrode may have a barrier metal formed of titanium, a titanium compound or the like at a layer underlying the region formed of aluminum or the like, and may have plugs formed of tungsten or the like in contact holes.

One or more gate trench portions 40 and one or more dummy trench portions 30 are arrayed at the upper surface of the semiconductor substrate 10 at predetermined intervals along a predetermined array direction. The array direction in FIG. 2 is the Y-axis direction. In the present specification, the array direction is occasionally referred to as a transverse direction. In the transistor portion 70, one or more gate trench portions 40 and one or more dummy trench portions 30 are located alternately along the array direction.

A gate trench portion 40 of the present example may have two extending portions 39 extending in parallel along an extending direction (the X-axis direction in the present example) perpendicular to the array direction, and an edge portion 41 connecting the two extending portions 39 at edges of the extending portions 39. In the present specification, the extending direction is occasionally referred to as a longitudinal direction. At least part of the edge portion 41 is preferably formed in a curved line-form at the upper surface of the semiconductor substrate 10. By connecting the edges of the two extending portions 39 of the gate trench portion 40, electric field concentration at the end portions of the extending portion 39 can be relaxed.

One or more dummy trench portions 30 are provided between individual extending portions 39 of gate trench portions 40. A dummy trench portion 30 may have an edge portion connecting edges of two extending portions, similarly to gate trench portions 40. In the present example, dummy trench portions 30 each having two extending portions and an edge portion are located between individual extending portions 39 of gate trench portions 40. A dummy trench portion 30 in another example may have a straight line shape not having an edge portion. Dummy trench portions 30 are provided at positions at which they do not overlap gate runners 45.

The emitter electrode 52 is provided above the gate trench portions 40, dummy trench portions 30, well region 11, emitter regions 12, base regions 14 and contact regions 15. The well region 11 is provided in a predetermined range from an end portion of the active portion 121 on the side where the gate metal layer 46 is provided. The well region 11 and ends, in the longitudinal direction, of the contact holes 54 are provided apart from each other on an X-Y plane. The diffusion depth of the well region 11 may be deeper than the depth of gate trench portions 40. Partial regions of the gate trench portions 40 that are on the gate metal layer 46 side are located in the well region 11.

The transistor portion 70 has one or more mesa portions 60 sandwiched by individual trench portions. A mesa portion 60 is a region which is in a region of the semiconductor substrate 10 sandwiched by trench portions and is on the upper surface side relative to the deepest bottom portions of the trench portions.

Individual mesa portions 60 have base regions 14. The base regions 14 are of P− type having doping concentrations lower than the well region 11. Upper surfaces of the base regions 14 of the mesa portions 60 have P+ type contact regions 15 having doping concentrations higher than the base regions 14. In addition, at the upper surfaces of the base regions 14, N+ type emitter regions 12 having doping concentrations higher than the semiconductor substrate 10 are selectively formed.

Each of the contact regions 15 and emitter regions 12 lies from one of trench portions that are in direct contact with it to the other trench portion. The contact regions 15 and emitter regions 12 are provided to be alternately exposed to the upper surface of the semiconductor substrate 10 along the extending direction (the X-axis direction) of the trench portions.

Mesa portions 60 of another example may have contact regions 15 and emitter regions 12 in stripe-like forms elongated along the extending direction. For example, regions in direct contact with trench portions have emitter regions 12, and regions sandwiched by the emitter regions 12 have contact regions 15.

The contact holes 54 are each provided above each region of the contact regions 15 and emitter regions 12. The contact holes 54 are not provided in regions corresponding to the base regions 14 and well region 11.

At the upper surface of the semiconductor substrate 10, the well region 11 may be provided apart, toward the gate metal layer 46, from contact regions 15 that are among the contact regions 15 and located at farthest ends in the Y-axis direction. At the upper surface of the semiconductor substrate 10, base regions 14 are exposed between the well region 11 and the contact regions 15.

Figure 3:
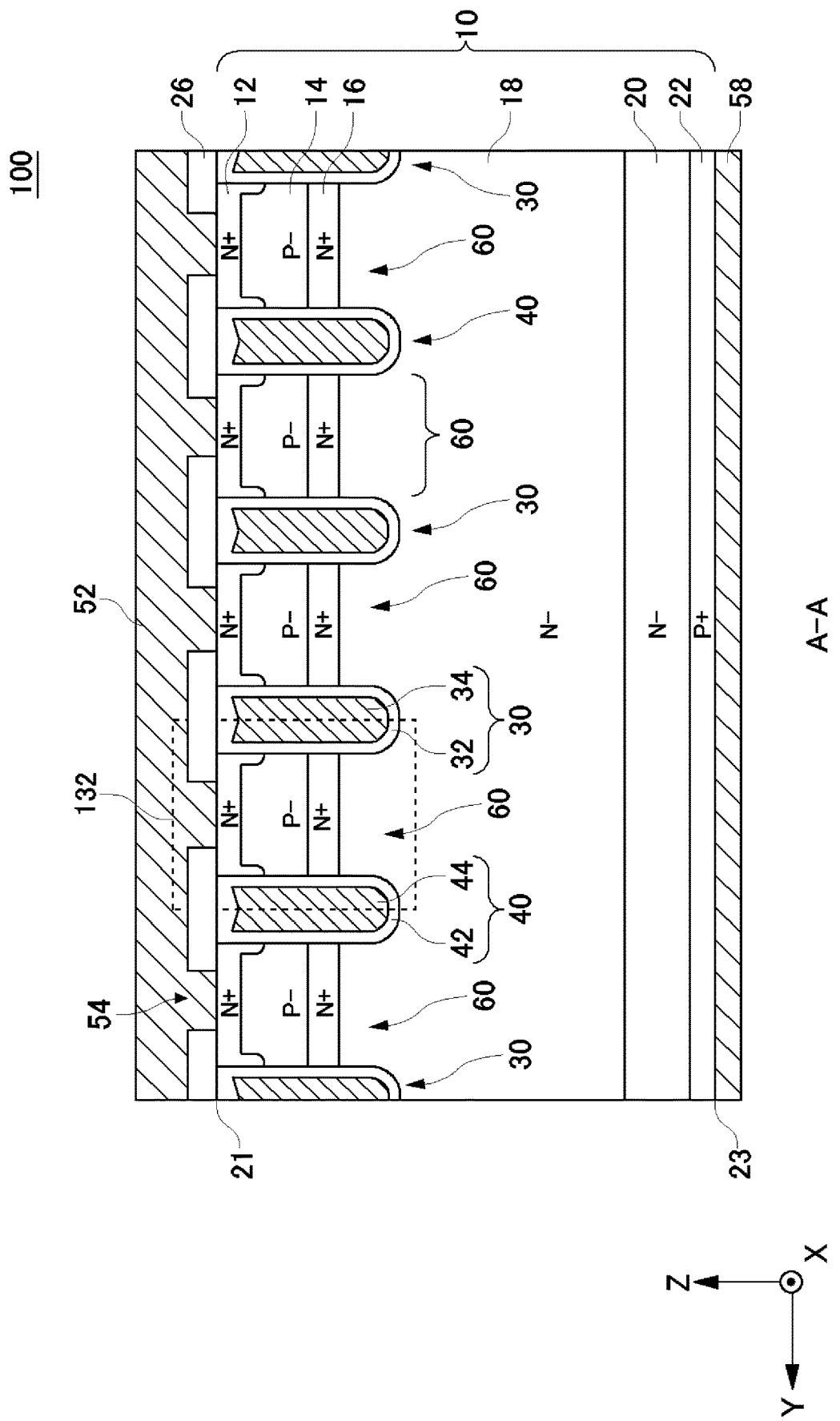
FIG. 3 is a figure showing an exemplary cross-section taken along A-A in FIG. 2.

FIG. 3 is a figure showing an exemplary cross-section taken along A-A in FIG. 2. The cross-section taken along A-A of the present example is a Y-Z plane. The semiconductor device 100 of the present example has, in the cross-section, the semiconductor substrate 10, an interlayer dielectric film 26, the emitter electrode 52 and a collector electrode 58. The interlayer dielectric film 26 is for example a silicate glass doped with impurities such as boron or phosphorus. The interlayer dielectric film 26 is selectively formed at an upper surface 21 of the semiconductor substrate 10. The emitter electrode 52 is provided at the upper surfaces of the semiconductor substrate 10 and interlayer dielectric film 26. The collector electrode 58 is provided at a lower surface 23 of the semiconductor substrate 10.

The semiconductor substrate 10 has an N− type drift region 18. The drift region 18 of the present example is a region that is in the semiconductor substrate 10 and is left free of emitter regions 12, base regions 14, accumulation regions 16, a buffer region 20 and a collector region 22, without those regions being formed therein.

P− type base regions 14 are provided between the upper surface 21 of the semiconductor substrate 10 and the drift region 18. The base regions 14 may be formed by implanting P type impurities such as boron from the upper surface 21 of the semiconductor substrate 10.

The upper surfaces of the base regions 14 have N+ type emitter regions 12. The emitter regions 12 may be formed by implanting N type impurities such as phosphorus from the upper surface 21 of the semiconductor substrate 10.

N+ type accumulation regions 16 are provided between the drift region 18 and the base regions 14. The accumulation regions 16 may be formed by implanting N type impurities such as phosphorus or proton from the upper surface 21 of the semiconductor substrate 10.

In the present example, gate trench portions 40 and dummy trench portions 30 are provided penetrating the emitter regions 12, base regions 14 and accumulation regions 16 from the upper surface 21 of the semiconductor substrate 10. Bottom portions of the gate trench portions 40 and dummy trench portions 30 of the present example are located in the drift region 18. Trench portions penetrating individual regions are not limited to those that are manufactured in the order of doping impurities, forming the individual regions and then forming the trench portions. Trench portions penetrating individual regions also include those that are formed by the procedure of forming the trench portions, and then forming the individual regions between the trench portions.

The buffer region 20 is provided on the lower surface side of the drift region 18. The doping concentration of the buffer region 20 is higher than the doping concentration of the drift region 18. The buffer region 20 may function as a field stop layer that prevents a depletion layer spreading from the lower surface side of the base regions 14 from reaching the P+ type collector region 22. The P+ type collector region 22 is provided on the lower surface side of the buffer region 20.

A gate trench portion 40 has a gate insulating film 42 and a gate conductive portion 44. The gate insulating film 42 is provided covering an inner wall of the gate trench. The gate insulating film 42 may be formed by oxidizing or nitriding a semiconductor on the inner wall of the gate trench. The gate conductive portion 44 is covered by the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 includes, in the depth direction, a region facing at least a directly contacting base region 14. The gate trench portions 40 in the cross-section are covered by the interlayer dielectric film 26 at the upper surface 21 of the semiconductor substrate 10. If a predetermined voltage is applied to the gate conductive portions 44, channels are formed at surface layers of interfaces that are part of base regions 14 and in contact with the gate trench portions 40.

A dummy trench portion 30 of the present example has a dummy insulating film 32 and a dummy conductive portion 34. The dummy insulating film 32 is provided covering an inner wall the dummy trench.

The dummy conductive portion 34 is provided inside the dummy trench portion 30 and is covered by the dummy insulating film 32. The dummy insulating film 32 insulates the dummy conductive portion 34 from the semiconductor substrate 10. The dummy conductive portion 34 may be formed of a material which is the same as the material of gate conductive portions 44. For example, the dummy conductive portion 34 is formed of a conductive material such as polysilicon. The dummy conductive portion 34 may have a length, in the depth direction, which is the same as the length of gate conductive portions 44. The dummy trench portions 30 in the cross-section are covered by the interlayer dielectric film 26 at the upper surface 21 of the semiconductor substrate 10.

By providing the dummy trench portions 30, the carrier accumulation effect can be enhanced to promote conductivity modulation and lower ON voltage. In addition, by adjusting the proportion of dummy trench portions 30 to gate trench portions 40, the switching speed of the semiconductor device 100 can be adjusted.

Figure 4:
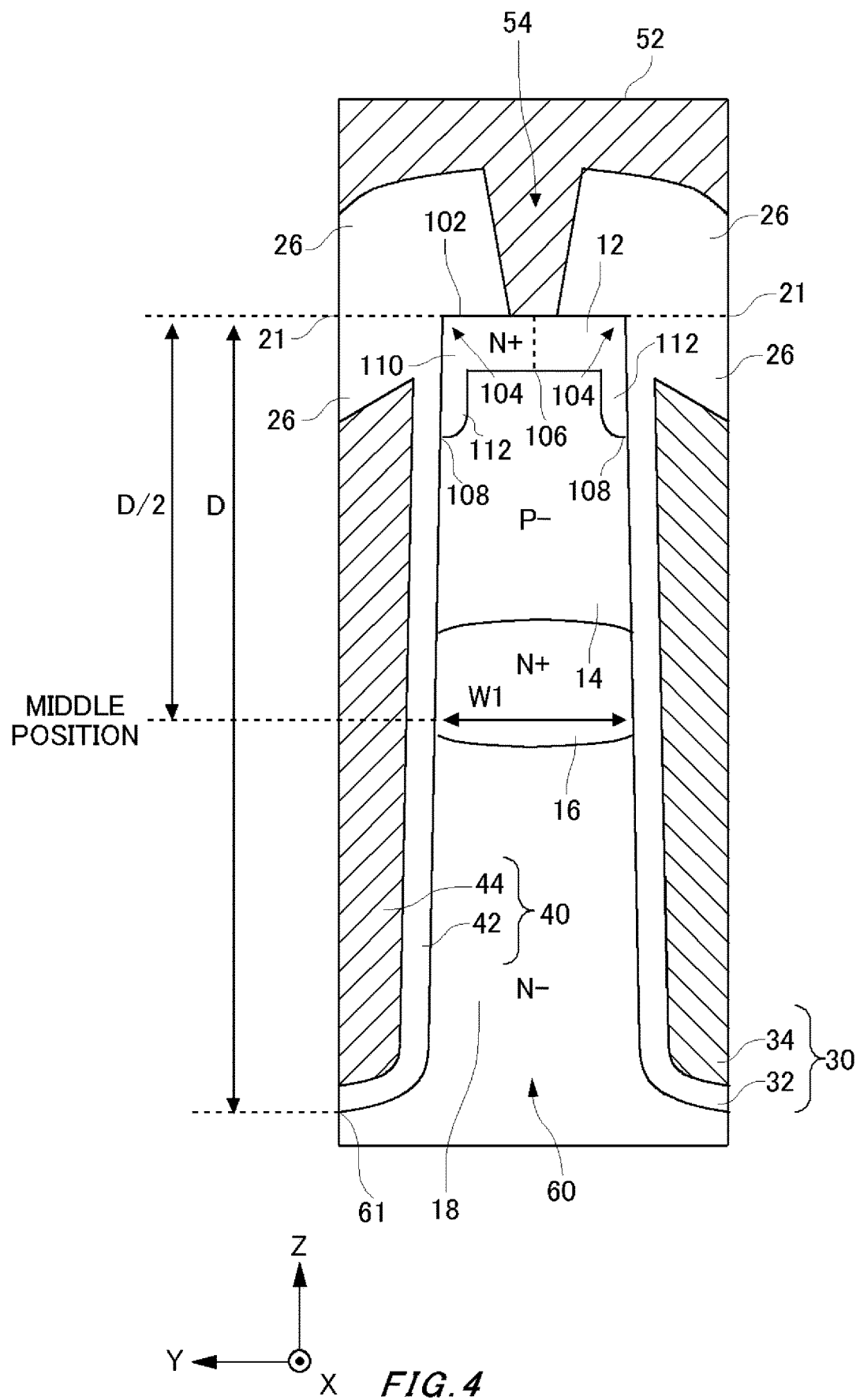
FIG. 4 is a figure showing an enlarged view of a section close to a region 132 in FIG. 3.

FIG. 4 is a figure showing an enlarged view of a section close to a region 132 in FIG. 3. The dimensional ratio of each member shown in FIG. 4 does not strictly match the dimensional ratio of each member shown in FIG. 3. As mentioned above, gate trench portions 40 lie from the upper surface 21 of the semiconductor substrate 10 to positions to reach the drift region 18 in the depth direction (the Z-axis direction) of the semiconductor substrate 10.

Inside the semiconductor substrate 10, mesa portions 60 are provided in contact with trench portions in the Y-axis direction. Although a mesa portion 60 shown in FIG. 4 is sandwiched by a gate trench portion 40 and a dummy trench portion 30, a mesa portion 60 may be sandwiched by two gate trench portions 40, or may be sandwiched by two dummy trench portions 30.

The mesa portion 60 has an upper surface 102. The upper surface 102 refers to a surface located uppermost (the +Z-axis direction side) in the mesa portion 60. As one example, the upper surface 102 is located at a height position (a position in the Z-axis direction) which is the same as the upper surface 21 of the semiconductor substrate 10.

The mesa portion 60 has shoulder portions 104 at end portions, in the Y-axis direction, of the upper surface 102. The mesa portion 60 shown in FIG. 4 has one shoulder portion 104 in contact with the gate trench portion 40 and another one shoulder portion 104 in contact with the dummy trench portion 30. Although the present specification explains the structure of and around the shoulder portion 104 in contact with the gate trench portion 40, the structure of and around the shoulder portion 104 in contact with the dummy trench portion 30 may also have a similar structure.

The shoulder portion 104 has an outwardly convex shape in a cross-section shown in FIG. 4 (the Y-Z cross-section; occasionally referred to as a transverse cross-section in the present specification). It is assumed that, relative to the shoulder portion 104, the mesa portion 60 side (the –Y-axis direction side and –Z-axis direction side) is the inner side, and the gate trench portion 40 side and interlayer dielectric film 26 side (the +Y-axis direction side and +Z-axis direction side) is the outer side. The shoulder portion 104 is not provided at positions higher than the upper surface 102.

The shape of the shoulder portion 104 in the Y-Z cross-section may be constituted by two or more straight lines, or may be constituted by a combination of straight lines and an outwardly convex curved line. As one example, the shape of the shoulder portion 104 in the Y-Z cross-section may be constituted by a straight line corresponding to the upper surface 102 and a straight line corresponding to a side wall of the gate trench portion 40 as shown in FIG. 4. In addition, the intersection of the two straight lines may be rounded to have an outwardly convex curved line. In addition, the shape of the shoulder portion 104 in the Y-Z cross-section may include a plurality of straight lines having inclinations whose absolute values gradually increase from the upper surface 102 toward the side wall of the gate trench portion 40. That is, the shoulder portion 104 may have a shape constituted by a plurality of straight lines which approximate to an outwardly convex curved line.

As mentioned above, the mesa portion 60 has an N+ type emitter region 12 that is in contact with the gate trench portion 40 between the upper surface 21 of the semiconductor substrate 10 and the drift region 18 and has a doping concentration higher than the drift region 18. It is assumed in the present specification that a direction perpendicular to both the depth direction (the Z-axis direction) and the longitudinal direction (the X-axis direction) is a transverse direction (the Y-axis direction).

The emitter region 12 has an upper region 110 and lower regions 112. The upper region 110 is a region including the middle, in the transverse direction, of the mesa portion 60. It is assumed in the present specification that the lower end of the emitter region 12 at the middle, in the transverse direction, of the mesa portion 60 is a lower end 106. The upper region 110 may be a region that is in the emitter region 12 and is above the lower end 106.

The lower region 112 is located in a region in contact with the gate trench portion 40. The lower region 112 is provided in a region in contact with the gate trench portion 40 and protruding downward from the upper region 110. It is assumed that the lower end of the lower region 112 is a lower end 108. The lower end 108 is a point that is in contact with the gate trench portion 40, and is located lowermost in the lower region 112. The lower end 108 of the lower region 112 is located, in the depth direction, at a position deeper (that is, a position lower) than the lower end 106 of the emitter region 12 at the middle of the mesa portion 60. The thickness of the lower region 112 in the transverse direction may be no greater than ⅓, no greater than ¼ or no greater than ⅕ of the width of the mesa portion 60 in the transverse direction.

According to the semiconductor device 100, the effective width of the upper surface 102 in which connections to the contact holes 54 are formed can be increased by giving the shoulder portions 104 of the mesa portion 60 outwardly convex shapes. Because of this, it becomes easier to allocate margins in the design positions of the contact holes 54 in the interlayer dielectric film 26, and miniaturization of the mesa portion 60 becomes easier.

In addition, the emitter region 12 extends deeper in a region in contact with the gate trench portion 40. Because of this, it becomes easier for the emitter region 12 to face the gate conductive portion 44. If in the structure in which the shoulder portions 104 have outwardly convex shapes, the emitter region 12 is formed by implanting impurities from the upper surface side of the semiconductor substrate 10, it becomes relatively difficult to form the emitter region 12 deep in a region in contact with the gate trench portion 40. In the present example, even if the shoulder portions 104 have outwardly convex shapes, the emitter region 12 can be easily formed deep in a region in contact with the gate trench portion 40 for example by forming the gate conductive portion 44 in the gate trench portion 40 and then implanting impurities in an oblique direction to the mesa portion 60. Because of this, threshold voltage controllability improves. That is, according to the semiconductor device 100, threshold voltage controllability can be improved while at the same time margins are allocated for the design of the contact holes 54.

In addition, as shoulder portions 104 have substantially perpendicular shapes, variation in shape of the shoulder portions 104 can be reduced among a plurality of mesa portions 60. That is, as a shoulder portion 104 needs not be formed by additional etching like a shoulder portion 104 shown in FIG. 7, it becomes unlikely for variation in shape to occur. As emitter regions 12 and the like are formed by implanting impurities from the upper surface 21 side of the semiconductor substrate 10, variation in shape of the shoulder portions 104 causes variation in depth of the emitter regions 12 in direct contact with the gate trench portions 40 or the like occurs, resulting in variation in threshold voltage and the like.

Figure 5:
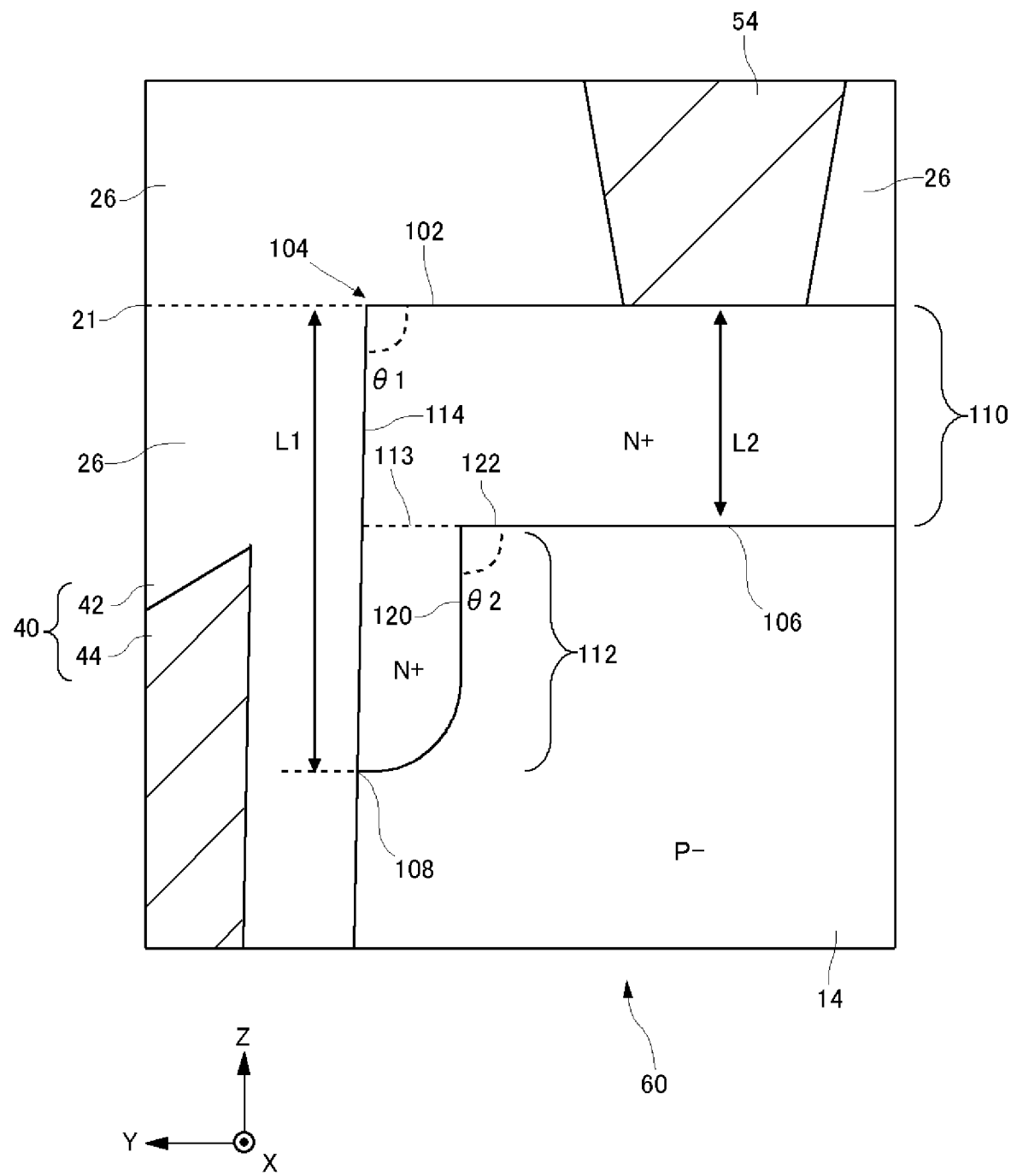
FIG. 5 is an enlarged view showing an exemplary section close to a shoulder portion 104.

FIG. 5 is an enlarged view showing an exemplary section close to a shoulder portion 104. As mentioned above, the emitter region 12 has an upper region 110 and a lower region 112. It is assumed that a distance in the Z-axis direction from the upper surface 21 of the semiconductor substrate 10 (or the upper surface 102 of the mesa portion 60) to the lower end 106 of the upper region 110 at the middle of the mesa portion 60 is L2, and a distance in the Z-axis direction from the upper surface 21 of the semiconductor substrate 10 (or the upper surface 102 of the mesa portion 60) to a lower end 108 of the lower region 112 is L1. The distance L1 is longer than the distance L2. The distance L1 may be no shorter than 120%, no shorter than 150% or no shorter than 200% of the distance L2.

The outer shape of the shoulder portion 104 of the present example is defined by two straight lines (the upper surface 102 and a side wall 114 of the shoulder portion 104) in the Y-Z cross-section. The side wall 114 of the shoulder portion 104 may have the same inclination as that of the side wall of the gate trench portion 40. The side wall 114 is substantially perpendicularly connected to the upper surface 102. In the present example, the angle formed between the side wall 114 of the shoulder portion 104 and the upper surface 102 in the Y-Z cross-section is assumed to be θ1. θ1 may be in the range of 88 degrees to 92 degrees inclusive, and in the range of 89 degrees to 91 degrees inclusive. In addition, it may be larger than 90 degrees and no greater than 95 degrees, and may be between 91 degrees and 93 degrees inclusive. The structure shown in FIG. 4 makes it easier to allocate a sufficient effective width for the upper surface 102 of the mesa portion 60.

In addition, the angle formed between the lower surface 122 of the upper region 110 and the side wall 120 of the lower region 112 is assumed to be θ2. θ2 may be approximately 90 degrees (that is, substantially perpendicular). The angle θ2 may be smaller than 90 degrees. That is, the angle formed between the lower surface 122 and the side wall 120 may be an acute angle. In another example, the angle θ2 may be no smaller than 90 degrees. In addition, in the present specification, a flat plane or curved plane formed by extending the lower surface 122 to the gate trench portion 40 is referred to as a connecting part 113 at which the upper region 110 and the lower region 112 are connected. In addition, the angle θ2 may be smaller than angle θ1. Thereby, threshold controllability improves, additionally the effective width of the upper surface 102 can be increased, and variation in shape of shoulder portions 104 can be reduced.

Figure 6:
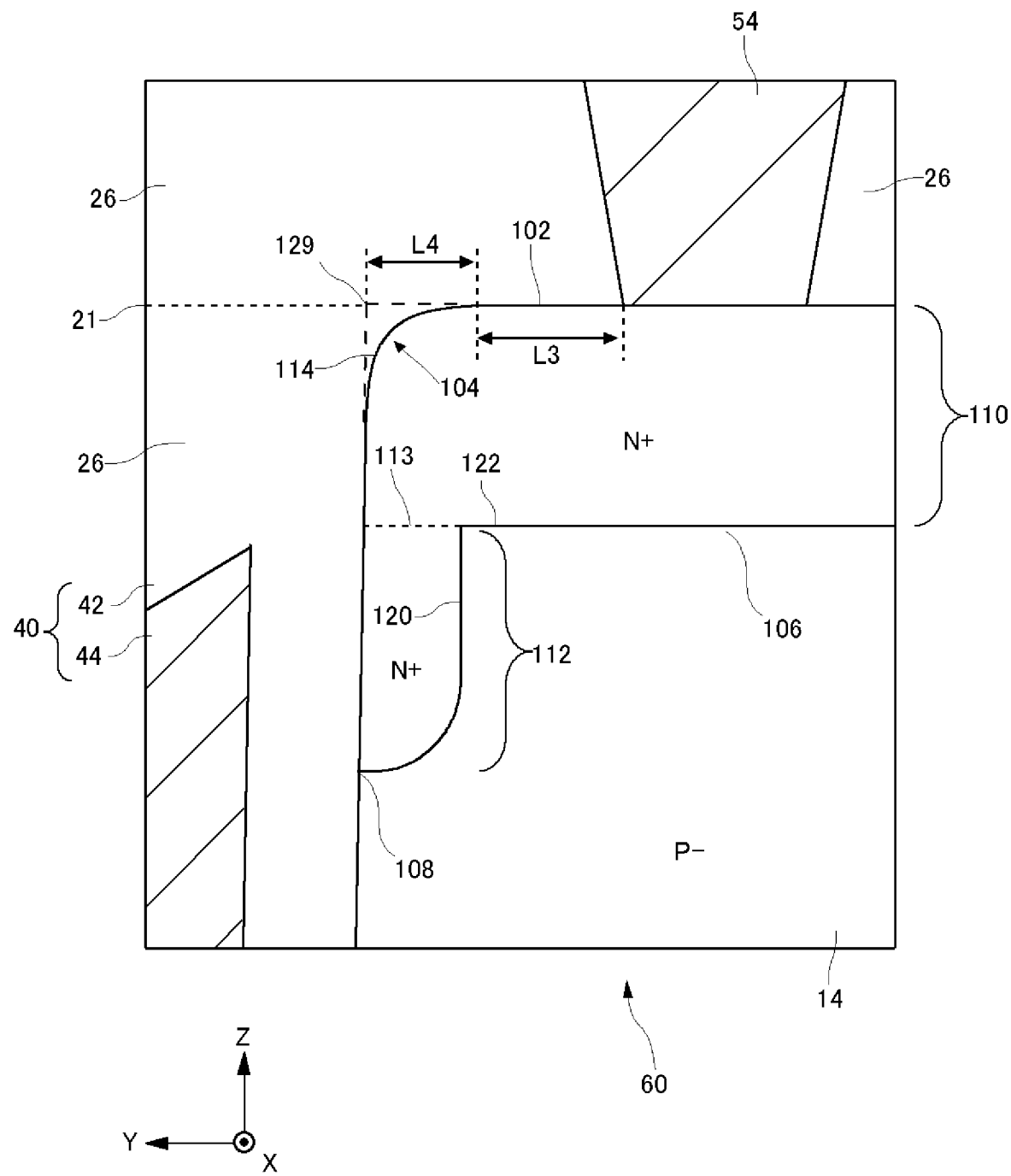
FIG. 6 is an enlarged view showing another exemplary section close to the shoulder portion 104.

FIG. 6 is an enlarged view showing another exemplary section close to the shoulder portion 104. The outer shape of the shoulder portion 104 of the present example is defined by an outwardly convex curved line in the Y-Z cross-section. In the present example, as shown in FIG. 4, it is assumed that a distance in the Z-axis direction from the upper surface of the semiconductor substrate 10 to a lower end 61 of the gate trench portion 40 is D, and the depth position of D/2 from the upper surface of the semiconductor substrate 10 is the middle position. In addition, a width, in the transverse direction, of the mesa portion 60 at the middle position is assumed to be W1. The radius of curvature of the shoulder portion 104 may be smaller than 15%, smaller than 10%, smaller than 5% or smaller than 1% of the width W1. The radius of curvature of the shoulder portion 104 may be smaller than the radius of curvature of the lower end 61 of the gate trench portion 40. The radius of curvature of the shoulder portion 104 may be smaller than the thickness of the gate insulating film 42. The radius of curvature of the shoulder portion 104 may be the same as the radius of curvature of a curved surface that is inevitably formed by etching or the like when it is attempted to form a substantially perpendicular shoulder portion 104 like the one shown in FIG. 5.

In addition, the position at which an extended line of a tangent, in the Y-Z cross-section, of a side wall of the gate trench portion 40 at the middle position to the height position of the upper surface 21 of the semiconductor substrate 10 crosses the upper surface 21 of the semiconductor substrate 10 is assumed to be a position 129. A length, in the Y-axis direction, of a region which is between a contact hole 54 and the position 129 and where the upper end of the mesa portion 60 is located at the same height as the upper surface 21 of the semiconductor substrate 10 is assumed to be L3. In addition, a length, in the Y-axis direction, of a region where the upper end of the mesa portion 60 is located below the upper surface 21 of the semiconductor substrate 10 is assumed to be L4. The length L3 may be longer than the length L4. The length L3 may be twice the length L4 or longer, ten times the length L4 or longer, and 100 times the length L4 or longer. The structure shown in FIG. 5 also makes it easier to allocate a sufficient effective width for the upper surface 102 of the mesa portion 60.

Figure 7:
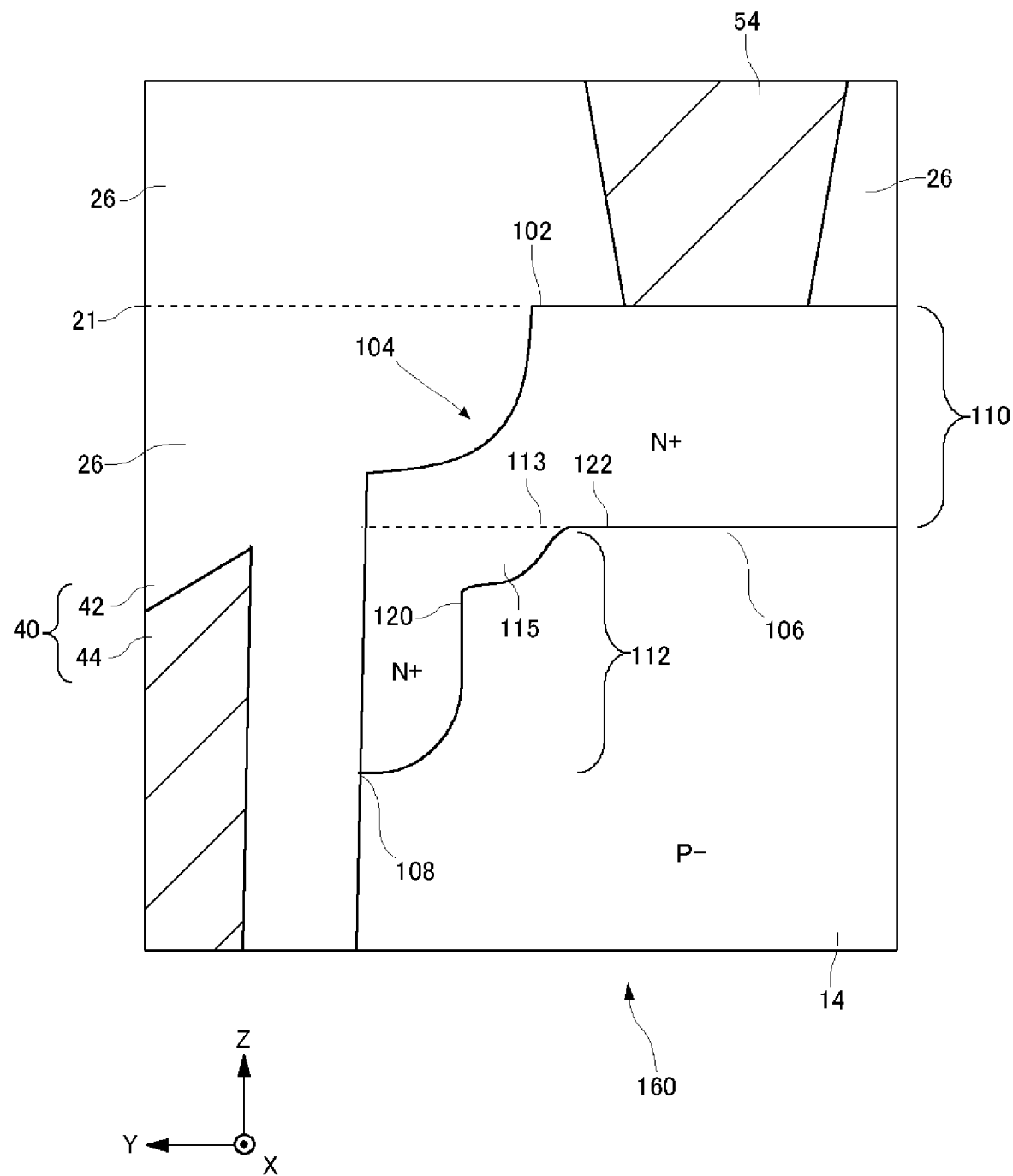
FIG. 7 is a figure showing an exemplary mesa portion 160 according to a comparative example.

FIG. 7 is a figure showing an exemplary mesa portion 160 according to a comparative example. A shoulder portion 104 of the mesa portion 160 has an inwardly convex shape. In this case, as shown in FIG. 7, the effective area of the upper surface 102 of the mesa portion 60 in which a connection to the contact hole 54 is formed inevitably decreases. In addition, an ion implantation region 115 reflecting the shoulder portion 104 with the inwardly convex shape is occasionally formed between the lower region 112 and the upper region 110. In this case, for example if the lower region 112 is formed excessively deep, the gate threshold might lower.

Figure 8:
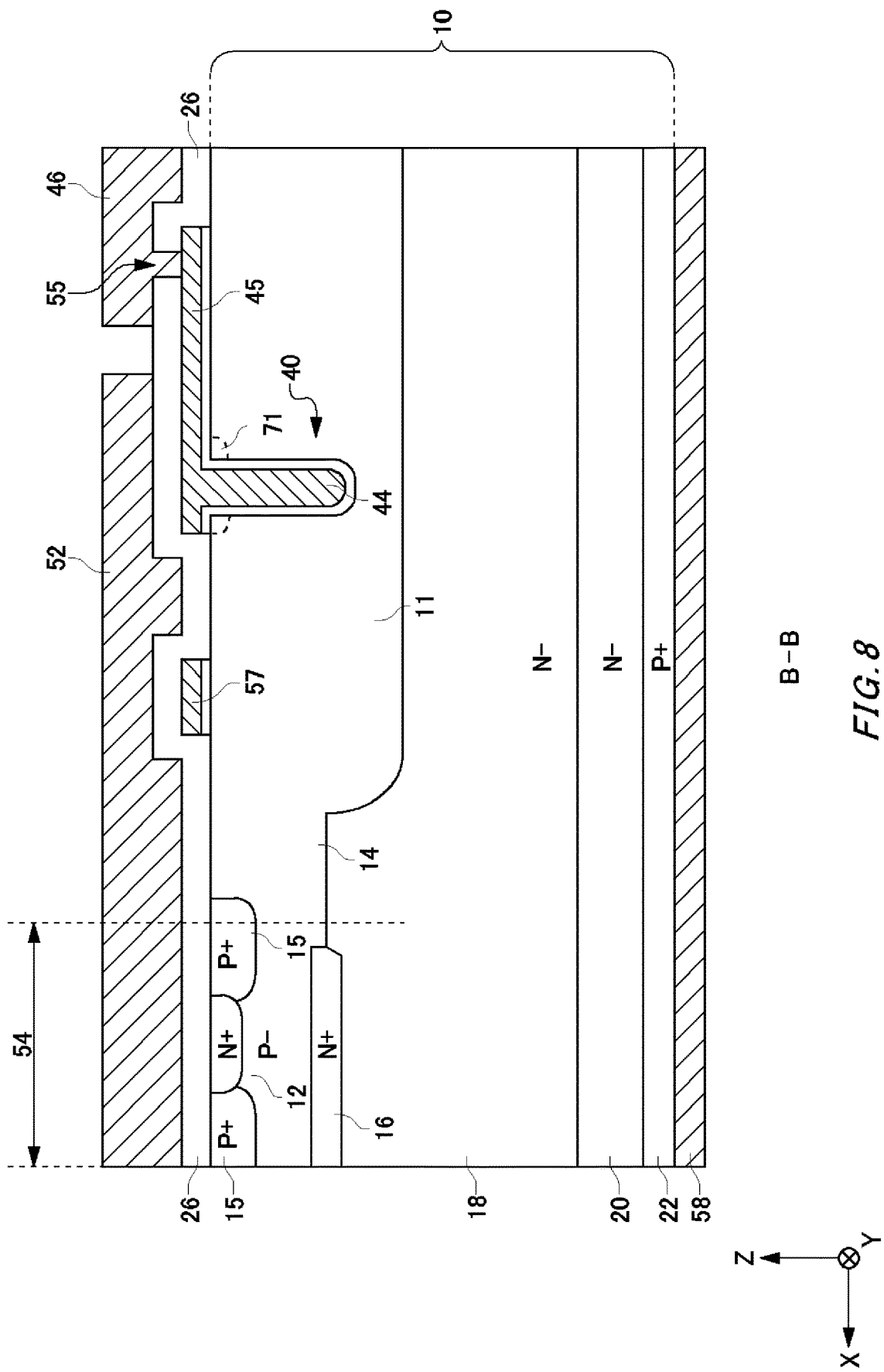
FIG. 8 is a figure showing an exemplary cross-section taken along B-B in FIG. 2.

FIG. 8 is a figure showing an exemplary cross-section taken along B-B in FIG. 2. The cross-section taken along B-B is an X-Z plane passing through a section close to a dummy trench portion 30. In a range in the X-axis direction in which a contact hole 54 is provided, contact regions 15 and an emitter region 12 are located alternately at the upper surface of the semiconductor substrate 10. In a range where the contact hole 54 is not provided, a base region 14 and the well region 11 are located at the upper surface of the semiconductor substrate 10.

A gate trench portion 40 is located to be surrounded by the well region 11. The gate trench portion 40 is connected with the gate metal layer 46 via a gate runner 45 located above the upper surface of the semiconductor substrate 10. An insulating film is provided between the gate runner 45 and the upper surface of the semiconductor substrate 10.

In this case, the moving direction of a carrier that moves between the gate conductive portion 44 and the gate metal layer 46 changes almost 90 degrees at a connecting part at which the gate conductive portion 44 and the gate runner 45 are connected. Here, if shoulder portions 71 of the semiconductor substrate 10 in direct contact with the gate trench portion 40 are formed substantially perpendicularly similar to the shoulder portion 104 shown in FIG. 5 and other figures, an electric field is concentrated at the shoulder portions 71 if gate voltage is applied.

Because of this, the shoulder portions 71 are preferably etched as indicated with broken lines in FIG. 8. For example, the shoulder portions 71 having inwardly convex shapes are formed by first forming the trench of the gate trench portion 40 and then forming shallow trenches by additional etching using widened openings of a mask.

However, if the shoulder portions 104 of the gate trench portion 40 in the active portion 121 are given inwardly convex shapes similar to the shoulder portions 71, as in the comparative example shown in FIG. 7, the area of the upper surface 102 in which a connection to the contact hole 54 is formed inevitably decreases. In the present example, the shoulder portions 104 of the mesa portion 60 in direct contact with the gate trench portion 40 in the active portion 121 have the shapes explained with reference to FIG. 1 to FIG. 6. The shoulder portions 71 in direct contact with the gate trench portion 40 connecting to the gate runner 45 and the shoulder portions 104 in direct contact with the gate trench portion 40 of the active portion 121 may have different shapes.

Figure 9:
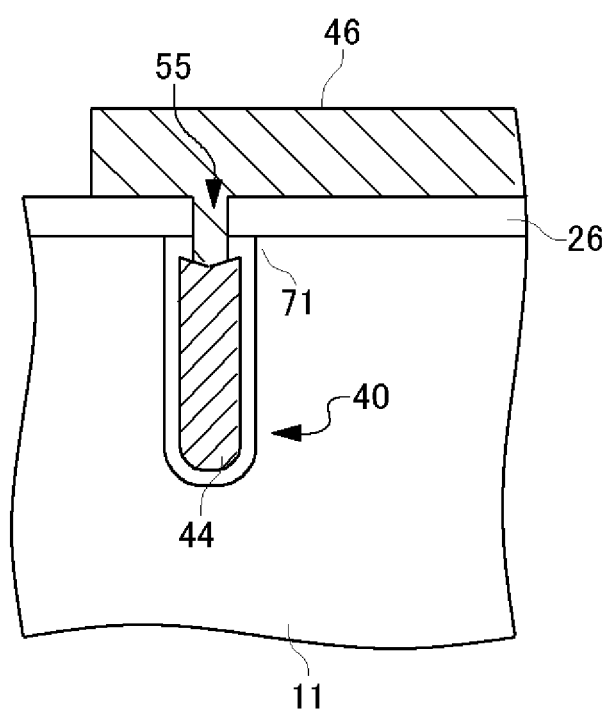
FIG. 9 is a figure showing another exemplary connection structure between a gate metal layer 46 and a gate conductive portion 44.

FIG. 9 is a figure showing another exemplary connection structure between the gate metal layer 46 and a gate conductive portion 44. The semiconductor device 100 of the present example does not include a gate runner 45 to connect the gate metal layer 46 and the gate conductive portion 44, and the gate metal layer 46 and the gate conductive portion 44 are directly connected. Specifically, a contact hole 55 is provided in the interlayer dielectric film 26 covering the gate conductive portion 44 and immediately above the gate conductive portion 44. The gate metal layer 46 passes through the contact hole 55, and directly contacts the gate conductive portion 44.

With such a structure, an electric field is not concentrated at the shoulder portions 71 even if the shoulder portions 71 in direct contact with the gate trench portion 40 connected with the gate metal layer 46 and the shoulder portions 104 in direct contact with the gate trench portion 40 of the active portion 121 are given substantially perpendicular shapes. Because of this, processes for manufacturing the semiconductor device 100 can be simplified.

Figure 10:
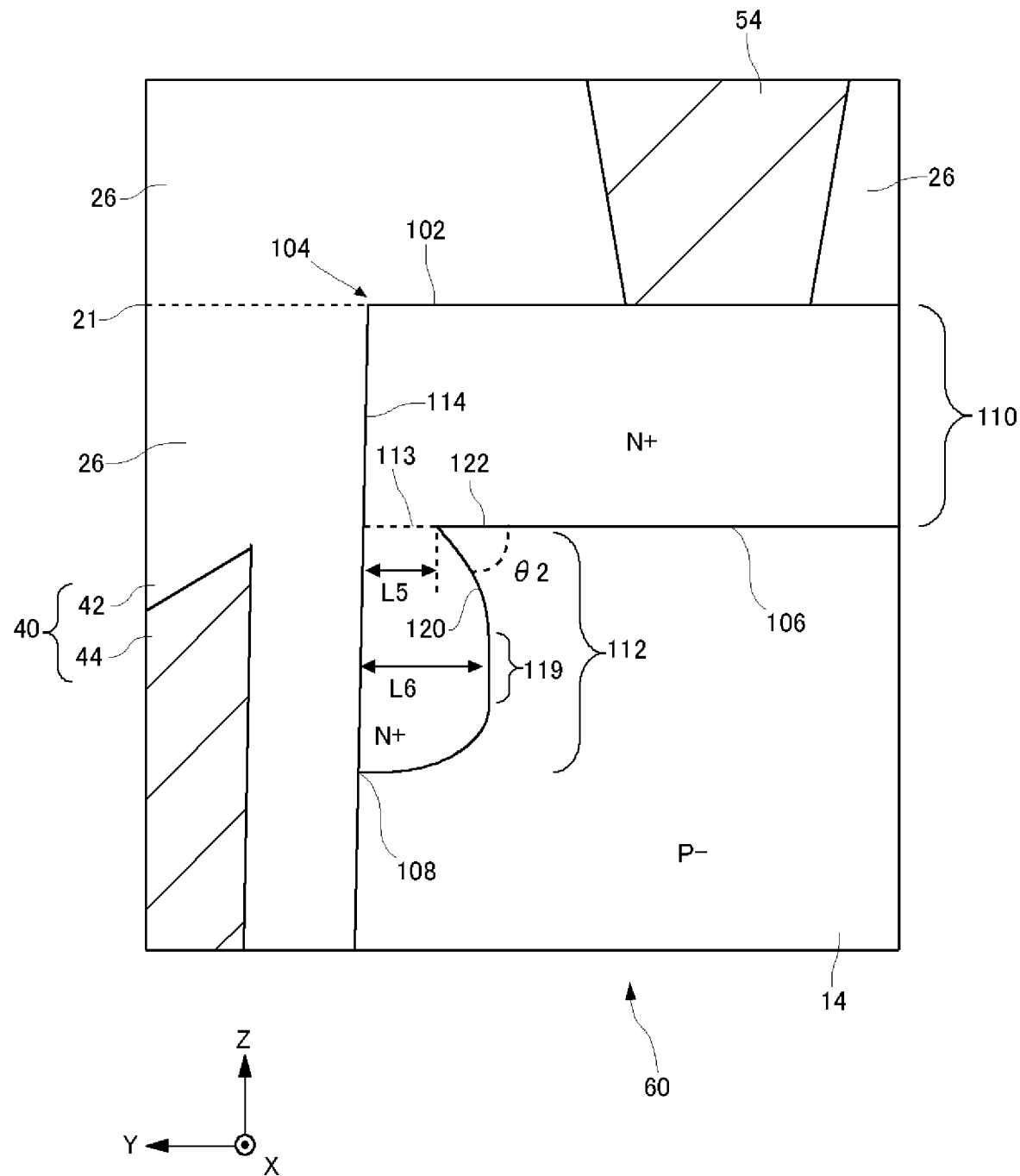
FIG. 10 is a figure showing another exemplary shape of a lower region 112 of an emitter region 12 in a Y-Z cross-section.

FIG. 10 is a figure showing another exemplary shape of the lower region 112 of the emitter region 12 in a Y-Z cross-section. In the present example, a length, in the Y-axis direction, of the lower region 112 at the connecting part 113 at which the lower region 112 and the upper region 110 are connected is assumed to be L5. Below the connecting part 113, the lower region 112 has a transverse wide part 119 with a width in the Y-axis direction larger than the length L5. The longest length in the Y-axis direction at the transverse wide part 119 is assumed to be L6. The length L6 may be no shorter than 105%, no shorter than 110% or no shorter than 120% of the length L5. In the present example, the angle θ2 formed between the lower surface 122 of the upper region 110 and the side wall 120 of the lower region 112 is an acute angle. The angle θ2 may be no greater than 85 degrees, and may be no greater than 80 degrees.

Figure 11:
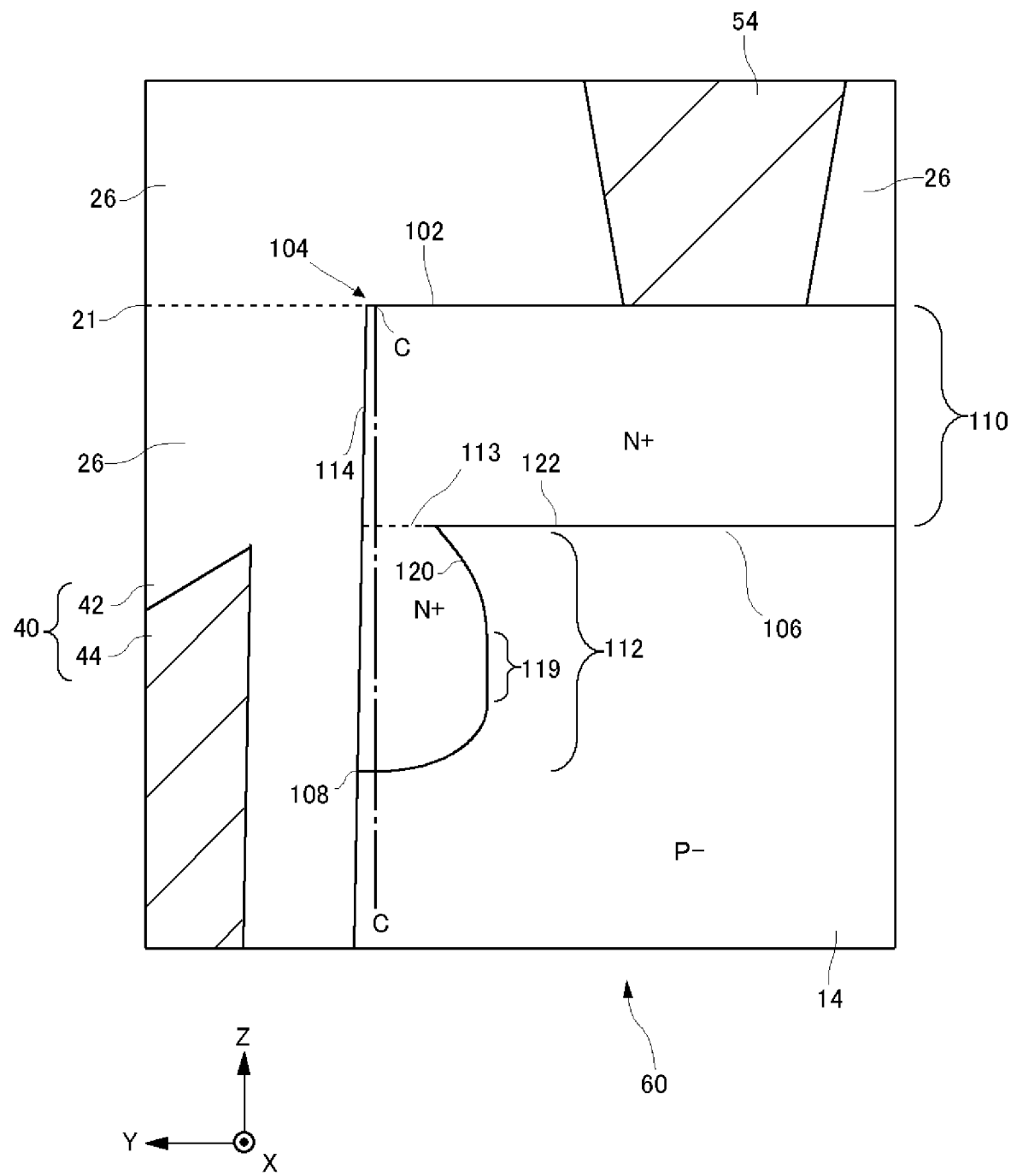
FIG. 11 is a figure for explaining a doping concentration distribution, in the depth direction, in the emitter region 12.
Figure 12:
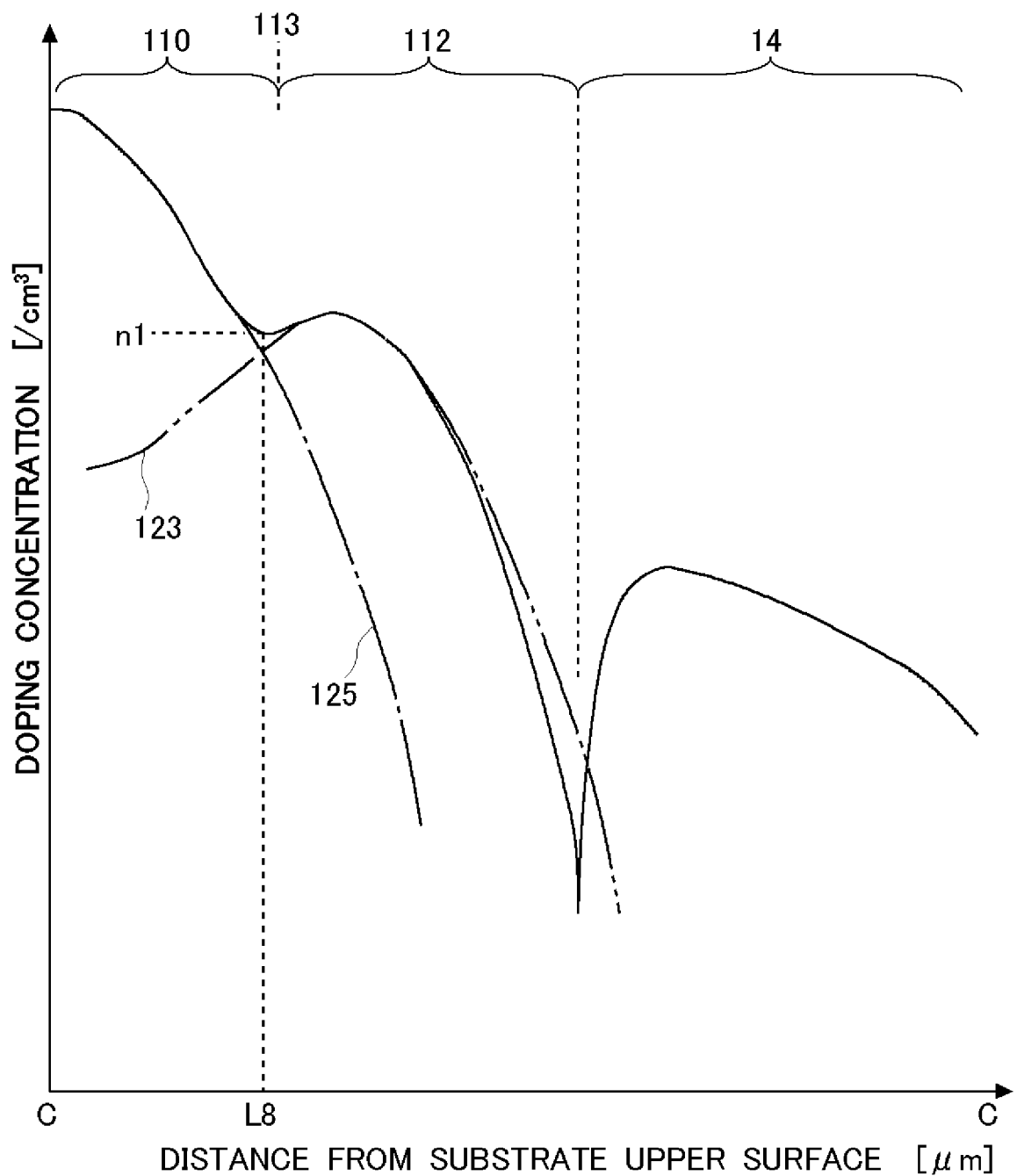
FIG. 12 is a figure for explaining a doping concentration distribution, in the depth direction, in the emitter region 12.

FIG. 11 and FIG. 12 are figures for explaining a doping concentration distribution, in the depth direction, in the emitter region 12.

FIG. 12 is a figure showing an exemplary doping concentration distribution in a cross-section taken along C-C in FIG. 11. The cross-section taken along C-C is a cross-section that is adjacent to the side wall 114 of the gate trench portion 40, and passes the upper end of the upper region 110 and the lower end of the lower region 112. The cross-section taken along C-C may be a boundary surface of the mesa portion 60 at which it contacts the side wall 114 of the gate trench portion 40, or may be a cross-section that is apart from the side wall 114 by a very short distance. The distance between the cross-section taken along C-C and the side wall 114 is no longer than 0.1 μm, as one example.

As shown in FIG. 12, in a region in contact with the gate trench portion 40, the doping concentration distribution, in the depth direction, of the emitter region 12 has a local minimum value n1 at a position L8 corresponding to the connecting part 113. The position corresponding to the connecting part 113 may be the same depth position as the connecting part 113 or may be a position in a predetermined range relative to the same depth position as the connecting part 113. The predetermined range may be no greater than 1 μm, no greater than 0.5 μm or no greater than 0.2 μm. In addition, the position L8 may be located above the connecting part 113.

Above the position L8, the dominant doping concentration distribution is obtained from diffusion of dopants implanted from the upper surface 102 of the mesa portion 60. In the distribution 125, as the distance from a section close to the upper surface 102 of the mesa portion 60 increases, the doping concentration lowers gradually.

Below the position L8, the dominant doping concentration distribution is obtained from diffusion of dopants implanted from a side surface of the mesa portion 60. The distribution 123 has a peak at a predetermined depth from the upper surface 102 of the mesa portion 60.

Because in the present example, the shoulder portions 104 of the mesa portion 60 have nearly perpendicular shapes, the position of the upper surface 102 of the mesa portion 60 becomes high also in a section close to the gate trench portion 40. Because of this, the distance between the distribution 125 and the distribution 123 relatively increases. The combination of these distributions provides a doping concentration distribution of the emitter region 12 which has a local minimum value n1 at the predetermined position L8.

Figure 13A:
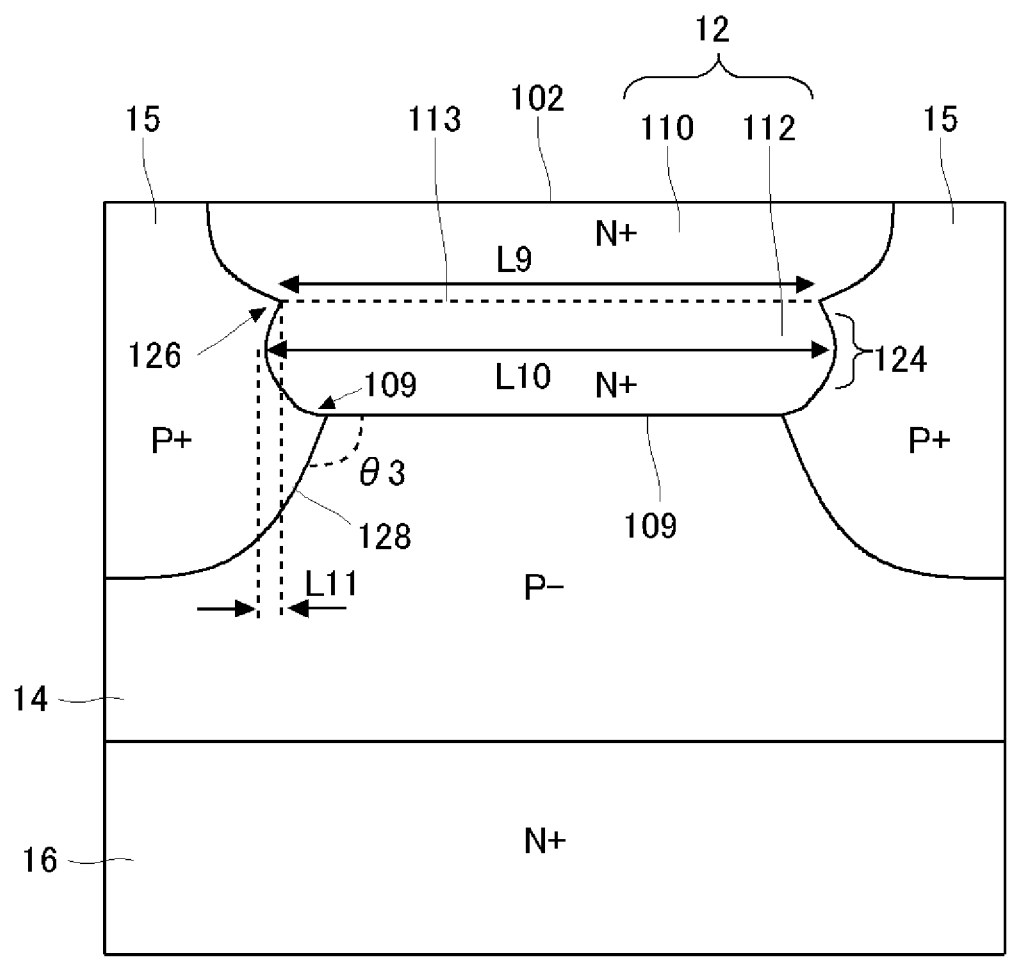
Figure 13A:
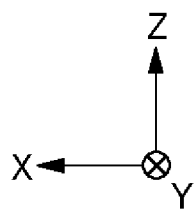

FIG. 13A is a figure showing an exemplary cross-section taken along D-D in FIG. 2. The cross-section taken along D-D is an X-Z cross-section (which is occasionally referred to as a longitudinal cross-section in the present specification) at the mesa portion 60 in a region in direct contact with the gate trench portion 40. Similar to the cross-section taken along C-C shown in FIG. 11, the cross-section taken along D-D may be a boundary surface of a mesa portion 60 at which it contacts a side wall 114 of a gate trench portion 40, and may be a cross-section that is apart from the side wall 114 by a very short distance. The distance between the cross-section taken along D-D and the side wall 114 is no longer than 0.1 μm, as one example.

Below the connecting part 113, the lower region 112 has a longitudinal wide part 124 with a width in the X-axis direction larger than the connecting part 113. It is assumed in the present example that a length, in the X-axis direction, of the lower region 112 at the connecting part 113 is L9, and a length, in the X-axis direction, of the largest width at the longitudinal wide part 124 is L10. The length L10 of the present example is longer than the length L9. The length L10 may be no shorter than 105%, no shorter than 110% or no shorter than 120% of the length L9.

The length L11 of protrusion of the longitudinal wide part 124 from the connecting part 113 in the X-axis direction may be between 0.1 μm and 0.3 μm inclusive. The length of protrusion may be between 0.15 μm and 0.25 μm inclusive.

In addition, contact regions 15 are provided in direct contact with an emitter region 12 in the X-axis direction. The contact regions 15 are in contact with the connecting part 113 at which an upper region 110 and a lower region 112 are connected. That is, the contact regions 15 are provided to enter indented parts 126 at the connecting part 113 of the emitter region 12.

As explained with reference to FIG. 12, the N type doping concentration in the emitter region 12 becomes relatively low in a section close to the connecting part 113. Because of this, if P type dopants are implanted and diffused so as to form P+ type contact regions 15, N type regions in a section close to the connecting part 113 are easily turned into P type. Because of this, as shown in FIG. 13A, the emitter region 12 and contact regions 15 have such shapes that the contact regions 15 enter the indented parts 126 at the connecting part 113 of the emitter region 12.

Figure 13B:
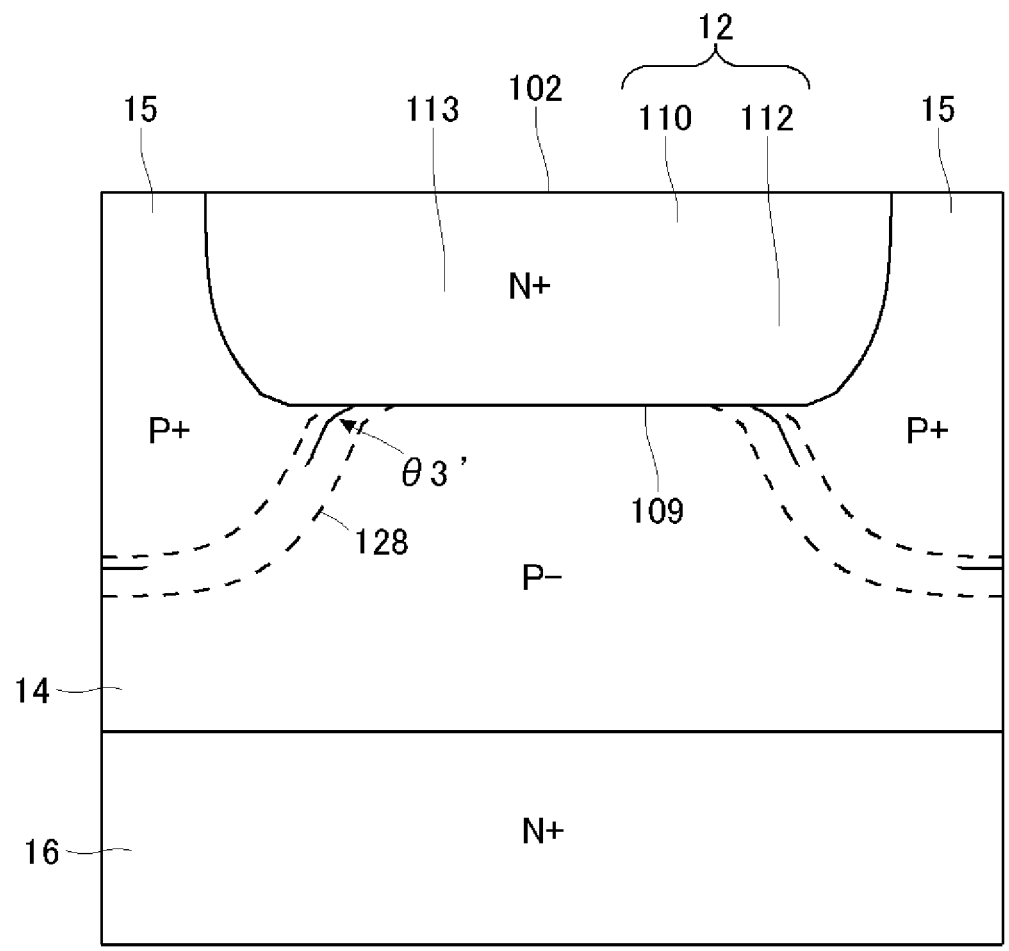
FIG. 13B is a figure showing a cross-section taken along D-D in a comparative example.
Figure 13B:
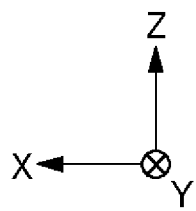

FIG. 13B is a cross-section taken along D-D of a comparative example. As mentioned above, in a section close to the connecting part 113, the P type dopants are easily diffused into the emitter region 12 (for example, toward the −X-axis direction side). Because of this, diffusion of the P type dopants in the depth direction is suppressed. If the P type dopants are excessively diffused in the depth direction, the area of a lower surface 109 of the emitter region 12 that is covered by the contact regions 15 increases. If the lower surface 109 of the emitter region 12 is covered by the contact regions 15, the length, in the X-axis direction, of a region to function as a channel decreases. In addition, at the time of turn-off, holes pass through the contact regions 15 from the lower surface 109 of the emitter region 12 along the boundary surface between the contact regions 15 and the emitter region 12. If dopants (in this case, an acceptor) of the contact regions 15 are diffused such that the contact regions 15 cover the lower surface 109 of the emitter region 12, the doping concentration of the contact regions 15 in the hole passage region lowers, and hole resistance easily increases. As a result, it becomes easier for latch-up to occur.

In contrast, according to the structure shown in FIG. 13A, covering of the lower surface 109 of the emitter region 12 by the contact regions 15 can be suppressed. Because of this, a sufficient length can be allocated for a channel region. Furthermore, because the above-mentioned lowering of the doping concentration of the contact regions 15 in the hole passage region can be suppressed, latch-up can also be suppressed.

In addition, the angle formed between the lower surface 109 of the emitter region 12 and the side walls 128 of the contact regions 15 is assumed to be θ3. The angle θ3 may be larger than 45 degrees and smaller than 135 degrees. The angle θ3 may be between 60 degrees and 120 degrees inclusive, and may be between 80 degrees and 100 degrees inclusive.

If there are no indented parts 126, it becomes easier for dopants (in this case, an acceptor) of the contact regions 15 to be diffused to cover the lower surface 109 of the emitter region 12 as explained in FIG. 13B. In this case, the doping concentration equiconcentration surface from the contact regions 15 to the base region 14 which is of the same conductivity type as the contact regions 15 gets to be distributed as if it infiltrates into the lower surface of the lower surface 109 of the emitter region 12. In FIG. 13B, the equiconcentration surface at a section close to the contact regions 15 and the base region 14 is indicated with broken lines. Because of this, assuming that the equiconcentration surface at a predetermined doping concentration is the side walls 128 of the contact regions 15, the angle θ3' formed by a side wall 128 with the lower surface 109 of the emitter region 12 becomes greater than 135 degrees.

In contrast, according to the structure shown in FIG. 13A, as mentioned above, because the P type dopants are diffused to the indented parts 126, the amount of the P type dopants diffused around down to the lower surface 109 of the emitter region 12 decreases. As a result, the angle θ3 becomes relatively small. The above-mentioned predetermined doping concentration may be a doping concentration of an equiconcentration surface at a portion where the doping concentration steeply changes from the contact regions 15 to the base region 14. More specifically, the above-mentioned predetermined doping concentration may be a doping concentration of an equiconcentration surface which is approximately three to thirty times, for example ten times, the highest value (peak concentration) of the doping concentration of the base region 14 in contact with the lower surface 109 of the emitter region 12.

Figure 14:
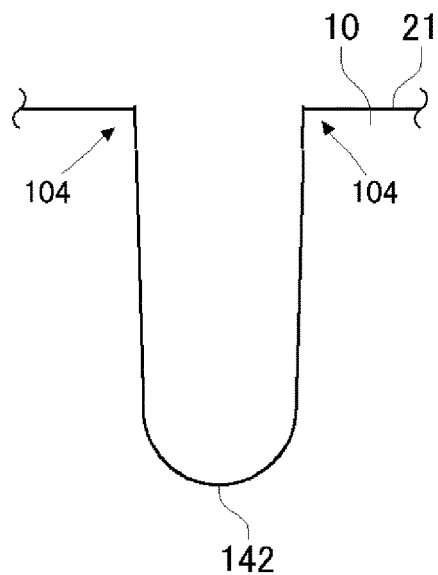
FIG. 14 is a figure for explaining part of a process for manufacturing a gate trench portion 40 and emitter regions 12 among portions and regions in the semiconductor device 100.
Figure 14:
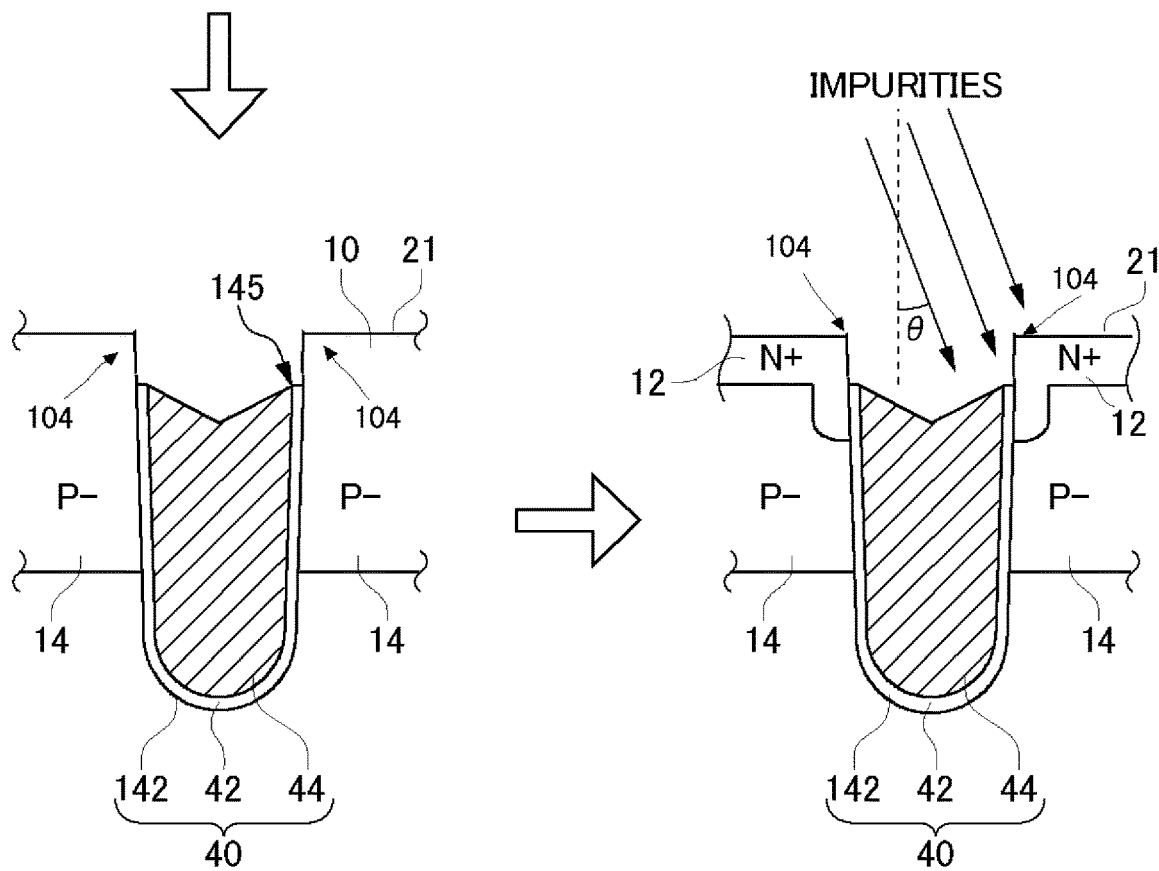

FIG. 14 is a figure for explaining part of a process for manufacturing a gate trench portion 40 and emitter regions 12 among portions and regions in the semiconductor device 100. First, at a gate trench formation step S1400, a gate trench 142 is formed at a surface of the semiconductor substrate 10. The gate trench 142 has shoulder portions 104 in regions in contact with the upper surface 21 of the semiconductor substrate 10. In the present example, after the gate trench 142 is formed, additional etching is not performed on the shoulder portions 104.

Next, at a gate conductive portion formation step S1402, a gate insulating film 42 and a gate conductive portion 44 are formed at the inner wall of the gate trench 142. The gate insulating film 42 may be formed by oxidizing the semiconductor substrate 10. The gate conductive portion 44 is formed such that an upper end 145 of the gate conductive portion 44 is located at a position deeper than the upper surface 21 of the semiconductor substrate 10. In the present example, the upper end 145 of the gate conductive portion 44 is provided below the shoulder portions 104. The gate conductive portion 44 is formed for example of polysilicon doped with impurities.

After depositing polysilicon to fill the inside of the trench portion, polysilicon is etched, and the upper surface of polysilicon is caused to be positioned inside the trench. The depth of the uppermost portion of the upper surface of polysilicon from the upper surface 102 of the semiconductor substrate may be between 0.1 μm and 0.7 μm inclusive.

After forming the gate conductive portion 44, P type impurities are implanted into and diffused at the surface of the semiconductor substrate 10, and the base region 14 is formed. The P type impurities are boron, for example. Diffusion temperature of the base region 14 is approximately 1100 degrees, for example. The gate trench portion 40 may be formed after the base region 14 is formed.

Next, at an emitter region formation step S1404, N type impurities are ion-implanted onto and diffused in the semiconductor substrate 10. The N type impurities are arsenic, for example. The N type impurities ion implantation is performed with the semiconductor substrate 10 being tilted by 1° or more and 10° or less to the implantation direction. Furthermore, the semiconductor substrate may be rotated using an orientation flat or notch of the semiconductor substrate as an index mark, such that the ion implantation direction matches the rotation axis. Temperature of the annealing process may be lower than diffusion temperature for the base region 14. Temperature of the diffusion process may be no higher than 1000° C., and may be between 850° C. and 1000° C. inclusive, for example. In addition, P type impurities such as boron are implanted into and diffused in contact regions 15. The impurities for the emitter regions 12 and contact regions 15 may be diffused in the same annealing process.

Thereby, the emitter regions 12 are formed. At S1404, impurities are implanted not only to the upper surface 21 of the semiconductor substrate 10, but also to the side wall of the gate trench 142 using the gate conductive portion 44 as a mask. At S1404, the impurities implantation direction has a predetermined inclination θ to the normal line of the upper surface 21 of the semiconductor substrate 10. The inclination θ is for example approximately 5 degrees to 10 degrees. With such a method, the emitter regions 12 are formed to have the deepest part at a part in contact with the gate trench 142.

As explained with reference to FIG. 12, in an upper region 110, a relatively large amount of impurities implanted from the upper surface 21 of the semiconductor substrate 10 is diffused downward. On the other hand, in a lower region 112, a relatively small amount of impurities implanted from the side wall of the gate trench 142 is diffused. Because of this, the doping concentration distribution shown in FIG. 12 is attained.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:
   a semiconductor substrate having a first conductivity type drift region;
   a gate trench portion that: lies, in a depth direction of the semiconductor substrate, from an upper surface of the semiconductor substrate to a position reaching the drift region; and is provided at the upper surface of the semiconductor substrate and extending in a predetermined longitudinal direction; and
   a mesa portion provided inside the semiconductor substrate and in contact with the gate trench portion, wherein
   the mesa portion has, at an end portion of an upper surface thereof, a shoulder portion in contact with the gate trench portion,
   in a transverse cross-section perpendicular to the longitudinal direction, the shoulder portion has an outwardly convex shape with the mesa portion side being an inner side and the gate trench portion side being an outer side,
   the mesa portion has a first conductivity type emitter region that: is in contact with the gate trench portion and positioned between the upper surface of the semiconductor substrate and the drift region; and has a doping concentration higher than the drift region,
   in a transverse direction perpendicular to both the depth direction and the longitudinal direction, a lower end of the emitter region at a position in contact with the gate trench portion is located at a deeper position in the depth direction than a lower end of the emitter region at a middle of the mesa portion, wherein
   the emitter region has:
      an upper region including the middle of the mesa portion; and
      a lower region that is provided in a region in contact with the gate trench portion and protrudes downward from the upper region, and
   below a connecting part at which the lower region connects with the upper region, the lower region has a transverse wide part with a width in the transverse direction larger than the connecting part.

2. The semiconductor device according to claim 1, wherein the shoulder portion has a side wall connected substantially perpendicularly to the upper surface of the semiconductor substrate.

3. The semiconductor device according to claim 1, wherein a radius of curvature of the shoulder portion in the transverse cross-section is smaller than 15% of a width, in the transverse direction, of the mesa portion at a middle position, in the depth direction, of the gate trench portion.

4. The semiconductor device according to claim 1, wherein
   in the transverse cross-section, a lower surface of the upper region and a side surface of the lower region are connected substantially perpendicularly.

5. The semiconductor device according to claim 1, wherein in the transverse cross-section, an angle formed between a lower surface of the upper region and a side surface of the lower region is smaller than an angle formed between an upper surface of the upper region and a side wall of the shoulder portion.

6. The semiconductor device according to claim 1, wherein in a region in contact with the gate trench portion, a doping concentration distribution, in the depth direction, of the emitter region has a local minimum value at a position corresponding to a connecting part at which the lower region and the upper region are connected.

7. The semiconductor device according to claim 1, wherein in a longitudinal cross-section perpendicular to the transverse direction of the mesa portion of a region in contact with the gate trench portion, below a connecting part at which the lower region connects with the upper region, the lower region has a longitudinal wide part with a width in the longitudinal direction larger than the connecting part.

8. The semiconductor device according to claim 7, wherein a length of protrusion of the longitudinal wide part from the connecting part in the longitudinal direction is between 0.1 nm and 0.3 nm inclusive.

9. The semiconductor device according to claim 1, wherein
   the mesa portion has:
      a second conductivity type base region provided below the emitter region; and
      a second conductivity type contact region that: is located alternating with the emitter region in the longitudinal direction; and has a doping concentration higher than the base region, and
   the contact region is in contact with a connecting part at which the lower region and the upper region are connected.

* * * * *